US008032776B2

(12) United States Patent  (10) Patent No.: US 8,032,776 B2
Merkin  (45) Date of Patent: Oct. 4, 2011

(54) SYSTEM FOR MAXIMIZING SERVER UTILIZATION IN A RESOURCE CONSTRAINED ENVIRONMENT

(75) Inventor: Aaron E. Merkin, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 12/259,133

(22) Filed: Oct. 27, 2008

(65) Prior Publication Data

US 2009/0044036 A1 Feb. 12, 2009

Related U.S. Application Data

(63) Continuation of application No. 11/209,870, filed on Aug. 23, 2005, now Pat. No. 7,461,274.

(51) Int. Cl.
 *G06F 1/00* (2006.01)
(52) U.S. Cl. ........ 713/324; 713/300; 713/320; 713/323; 713/340; 340/635
(58) Field of Classification Search .................. 713/300, 713/320, 323, 324, 340; 340/635
See application file for complete search history.

(56) References Cited

U.S. PATENT DOCUMENTS

| | | | |
|---|---|---|---|
| 5,522,042 A | 5/1996 | Fee et al. | |
| 6,516,350 B1 | 2/2003 | Lumelsky et al. | |
| 6,674,756 B1 | 1/2004 | Rao et al. | |
| 6,968,470 B2 | 11/2005 | Larson et al. | 713/340 |
| 7,051,215 B2 * | 5/2006 | Zimmer et al. | 713/300 |
| 7,131,019 B2 * | 10/2006 | Lee | 713/340 |
| 7,237,130 B2 | 6/2007 | Lee | 713/323 |
| 7,272,732 B2 * | 9/2007 | Farkas et al. | 713/320 |
| 7,349,828 B1 * | 3/2008 | Ranganathan et al. | 702/186 |
| 7,353,415 B2 * | 4/2008 | Zaretsky et al. | 713/320 |
| 7,418,608 B2 * | 8/2008 | Kumar et al. | 713/320 |
| 2002/0002609 A1 | 1/2002 | Chung et al. | |
| 2003/0005339 A1 | 1/2003 | Cohen et al. | 713/300 |
| 2003/0028642 A1 | 2/2003 | Agarwal et al. | |
| 2003/0046393 A1 | 3/2003 | Mueller et al. | |
| 2003/0046396 A1 | 3/2003 | Richter et al. | |
| 2003/0056126 A1 | 3/2003 | O'Connor et al. | 713/300 |
| 2003/0065986 A1 | 4/2003 | Fraenkel et al. | |
| 2003/0084157 A1 | 5/2003 | Graupner et al. | |
| 2003/0110263 A1 | 6/2003 | Shillo | |
| 2003/0135509 A1 | 7/2003 | Davis et al. | |
| 2003/0217153 A1 | 11/2003 | Rao et al. | |
| 2004/0003303 A1 | 1/2004 | Oehler et al. | 713/300 |
| 2005/0055587 A1 | 3/2005 | Lee | |
| 2006/0184287 A1 | 8/2006 | Belady et al. | 700/291 |
| 2006/0230299 A1 | 10/2006 | Zaretsky et al. | 713/320 |

OTHER PUBLICATIONS

Hitachi Ltd. White Paper on Power-Saving Modes of Microsoft Windows Server 2008 SP2 on BladeSymphony 320. Revision 1.0.0. Sep. 2009.*
Super Micro Computer Inc. SuperBlade User's Manual. Revision 1.0d. Nov. 3, 2010.*
Hewlett-Packard Development Company. HP Power Capping and HP Dynamic Power Capping for ProLiant servers. Technology brief. 2nd edition. Jan. 2011.*
Inventor Name Search Result for Aaron Merkin dated Feb. 8, 2008, pp. 1-2.
Office Action from Chinese Patent Office dated Jan. 29, 2010.

* cited by examiner

*Primary Examiner* — Matthew Spittle
(74) *Attorney, Agent, or Firm* — Winstead, P.C.

(57) ABSTRACT

A mechanism for controlling the hardware resources on a blade server, and thereby limiting the power consumption of the blade server is disclosed. The enforceable hardware resources that are controlled include the base frequency of the central processing unit (CPU) as well as power to individual banks of physical memory, for example dual-inline memory modules (DIMMs). The hardware resources are tuned in dependence on actual server utilization such that applications running on the blade only have the allocated hardware resources available to them. Deactivated hardware resources are powered off and are so 'hidden' from the operating system when they are not required. In this manner, power consumption in the entire chassis can be managed such that all server blades can be powered on and operate at higher steady-state utilization. The utilization of the powered on resources in a blade center is also improved.

5 Claims, 12 Drawing Sheets

SYSTEM FOR MAXIMIZING SERVER UTILIZATION IN A RESOURCE CONSTRAINED ENVIRONMENT

CROSS REFERENCE TO RELATED APPLICATIONS

The present application is a continuation application of U.S. patent application Ser. No. 11/209,870, which was filed on Aug. 23, 2005, which is assigned to the assignee of the present invention. The present application claims priority benefits to U.S. patent application Ser. No. 11/209,870.

TECHNICAL FIELD

The present invention relates in general to data processing systems, and in particular, to communications network devices referred to as blade servers.

BACKGROUND INFORMATION

The use of servers as devices within communications networks is well known in the art. A server is equipment that makes available file, database, printing, facsimile, communications or other services to client terminals/stations with access to the network the server serves. When the server permits client/terminal station access to external communications network it is sometimes known as a gateway. Servers are available in different sizes, shapes and varieties. Servers may be distributed throughout a network or they may be concentrated in centralized data centers.

Advances in centralized data processing centers have resulted in smaller form factors for server devices and an increase in the density of processing units, thereby reducing space requirements for computing infrastructure. One common form factor has been termed in the art a blade server, comprising a device built for vertically inserting into a chassis that can house multiple devices that share power and other connections over a common backplane, i.e., a blade center. Slim, hot swappable blade servers fit in a single chassis like books in a bookshelf—and each is an independent server, with its own processors, memory, storage, network controllers, operating system and applications. The blade server, also referred to simply as a blade, slides into a bay in the chassis and plugs into a mid- or backplane, sharing power, fans, floppy drives, switches, and ports with other blade servers. The benefits of the blade server approach will be readily apparent to anyone tasked with running down hundreds of cables strung through racks just to add and remove servers. With switches and power units shared, precious space is freed up—and blade servers enable higher density with far greater ease. With a large number of high-performance blade servers in a single chassis, blade technology achieves high levels of density.

Even though power consumption and device complexity per unit of processing power may actually decrease with a blade center, since the physical density of the computing devices has increased, the demands on power consumption for processing power and cooling have also intensified as overall computing power has increased. A blade center chassis has resources such as power and cooling that are shared by multiple components in the enclosure. A management module is present in each chassis which is responsible for managing all components within a chassis and the relationship between them. Each blade server is allocated a fixed amount of power or cooling capacity. If any blade server exceeds its allocation, it can force the entire chassis to exceed threshold values, which can, in turn, force the common power supply to shut down, causing other blade servers to be turned off. Another risk is that any blade server exceeding its allocation can cause other blade servers to shutdown due to temperatures exceeding their critical thresholds.

Probably, one of the most pressing problems associated with servers is manageability and particularly manageability as applied to chassis mounted servers. One aspect of manageability within this type of server relates to managing performance within the constraints of the available resources. Well-known in the art are management methods and their related system architectures for maintaining a sufficient level of computing power and aggregate data throughput in the face of highly fluctuating or deterministic service requests. Documented application server resource management methods aim to provide an optimum level of service for a given set of resources, subject to a certain demand of computing power; upon total utilization of available resources, the methods generally assume that the processing power is expandable ad infinitum, thus demanding additional computing infrastructure. However, certain instrinsic resource constraints on any given computing center location, such as available electrical power, space, and cooling, are finite and thus effectively limit further expansion of that infrastructure. Projects for expanding or duplicating an existing computing center often require significant corporate resources and carry an economic impact that goes well beyond the cost of the core computing infrastructure. As blade server performance values, such as processor speeds and bus clock frequencies, have increased dramatically, electrical power requirements within a single blade center have frequently reached constraining values, such that it may not be unusual that insufficient electrical power is available in a given chassis to simultaneously power on all blade servers present in the chassis. Furthermore, since a blade center chassis will often be dimensioned for future growth and expansion, newer, faster, power-hungry blade servers may need to be added to an existing chassis, which would normally exceed the rated values for power consumption.

All of the aforementioned factors indicate that power resources are a critical element in the economic success of a blade center. Therefore, a key aspect of manageability within this type of application server relates to allocating power resources, which has been solved by system architecture in past configurations by forcing individual blade servers to shutdown, or not permitting additional blade servers to power on. Clearly, a scenario where not all blade servers in a chassis may be powered on is economically detrimental for the operator of the blade center.

The computing resources within an individual blade server are unfortunately often wasted due to low utilization during normal operation, whereby the power allocated to (and consumed by) an individual blade server remains constant, usually at full power for all components. When determining server resources required for a target application, the administrator generally has to plan for the worst-case scenario. In one illustrative example, 80% of the time, an application may require some X amount of resources, comprising CPU cycles and physical memory. The other 20% of the time, the application may require 2× amount of those resources. In order to provide for that 20% of the time, the administrator was forced to dimension the server with 2× resources for the application to run on.

There are two ways to allocate power within a blade center chassis. In one case, illustrated in FIGS. 1 and 2, a subset of blade servers can be allocated power sufficient to meet their maximum power consumption. This may result in underutilization of resources, as in the previous example, where 80% of the time only X amount of resources are utilized in a system providing 2× amount of resources. Alternatively, a subset of the blade servers can be allocated power for them to run at a lower percentage of their maximum power consumption, as illustrated in FIG. 3. Since the power allocation is unenforceable, any spike in utilization by an application will result in an increase in power consumption, which can drive the aggregate power consumption over the capacity of the common power supply, catastrophically causing all servers in the chassis to fail or be shutdown.

In view of the above problems, a more efficient system and more reliable method is needed in the art for managing blade server utilization in an environment where electrical power is constrained.

SUMMARY OF THE INVENTION

The present invention addresses the foregoing needs by providing a mechanism for controlling the hardware resources on a blade server, and thereby limiting the power consumption of the blade server in an enforceable manner. The hardware resources that are controlled include the base frequency of the central processing unit (CPU) as well as power to individual banks of physical memory, for example dual-inline memory modules (DIMMs). The hardware resources are controlled to constrain the power required by the blade server, thereby reducing computing power of the blade server. The system and method of the present invention tunes the hardware resources in dependence on actual server utilization such that applications running on the blade server only have the allocated hardware resources available to them. Deactivated hardware resources are powered off and are so withheld from the operating system when they are not required. In this manner, power consumption in the entire chassis can be managed such that all blade servers can be powered on and operate at higher steady-state utilization. While there may be insufficient power and cooling available for operating all blade servers at 100% hardware resources, sufficient computing power may be achieved by operating all blade servers at some lower percentage of enabled hardware resources. Thus, the present invention provides a method for brokering allocated power among the blade servers in a blade center chassis and thereby distributing the available electrical power more effectively among a greater number of powered on blade servers. The utilization of the powered on resources in a blade center is also improved with the present invention.

One component of the present invention comprises hardware resource monitoring by a monitoring agent software running in the operating system that can monitor and report the utilization of physical memory and CPU cycles. The present invention leverages off standard protocols and interface support for throttling CPU speeds and hot plugging memory modules. A chassis power management software, running on a management module, serves as the resource broker within the blade center and may scale down the resources available to an application on a blade server to achieve some steady state threshold (SST), for example 90%. This has the effect of placing a limit on that server's power consumption, which is less than the value associated with the server running at full capacity. The chassis power management software may then allocate less power to the blade server than would be required for full-power operation. Through a shrewd combination of throttling the CPU and disabling memory DIMMs, the upper limit on power consumption is enforced. Even if the demands on the hardware resources from the application rise sharply or spike suddenly, the available hardware resources and power consumption remain constrained. When a monitoring agent software running on the blade server detects that utilization of a server resource is exceeding the SST and climbing towards a trending upwards threshold (TUT), a determination according to algorithm or policy will be made regarding the amount of additional blade server resources (CPU cycles or DIMMs) to make available to the operating system. The additional physical resources on the individual blade server will have a corresponding requirement for shared resources in the blade center chassis, i.e., electrical power and cooling capacity. The resource monitoring agent software will request that the management module, acting in the capacity of a resource broker for the common pool of unused power and cooling resources in the chassis, allocate sufficient power from the pool to the blade server for adjusting upwards the amount of server resources available to the application. Similarly, when the resource monitoring agent software detects that monitored values for server resources have fallen below a trending downwards threshold (TDT), it can remove resources from the operating system and power them down. The monitoring agent on the blade server then sends a notification to the management module that the blade server is thereby releasing its corresponding allocation of the shared resources back to the pool. For the purposes of controlling power consumed by the CPU, simple CPU utilization may represent values for the monitored threshold quantities SSU, TUT, and TDT, in one embodiment of the present invention. For the purposes of controlling power consumed by memory in another example of the present invention, percent of physical memory used, number of page faults, or a combination thereof may represent values for the monitored threshold quantities SSU, TUT, and TDT.

The present invention provides numerous advantagous benefits for manageability issues. The present invention allows the continued allocation to individual applications of a single server for ensuring that resources are available for meeting peak requirements during usage of the application. When an application is running below peak requirements, power consumption by individual servers is reduced by scaling down resources in use. When the aggregate total of resources required to support servers running at maximum utilization exceeds that which is available to them in the common pool, the present invention allows the servers to execute at levels tailored to their steady state requirements while ensuring that utilization spikes do not cause the resources available in the common pool to be exceeded.

An object of the present invention is to provide a mechanism for controlling the power allocated to individual blade servers in a blade center in an enforceable manner, whereby the control of the allocated power is retained by a management module in the blade center chassis.

Another object of the present invention is to increase the effective utilization of blade servers in a blade center chassis for a given computing workload at a given power consumption level.

Another object of the present invention is to provide the ability to use a combination of blade servers in a blade center that would otherwise exceed the maximum power rating for that blade center power supply.

Another object of the present invention is to provide for a common pool of reserve power that may be allocated to individual blade servers so that they may operate at power consumption levels tailored to their steady state requirements.

Still another object of the present invention is ensuring that utilization spikes do not cause reserve power resources in the common pool to be exceeded and preventing thereby a total loss of power in the blade center chassis, caused by overloading the common power supply or by exposure to excessive thermal loading.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
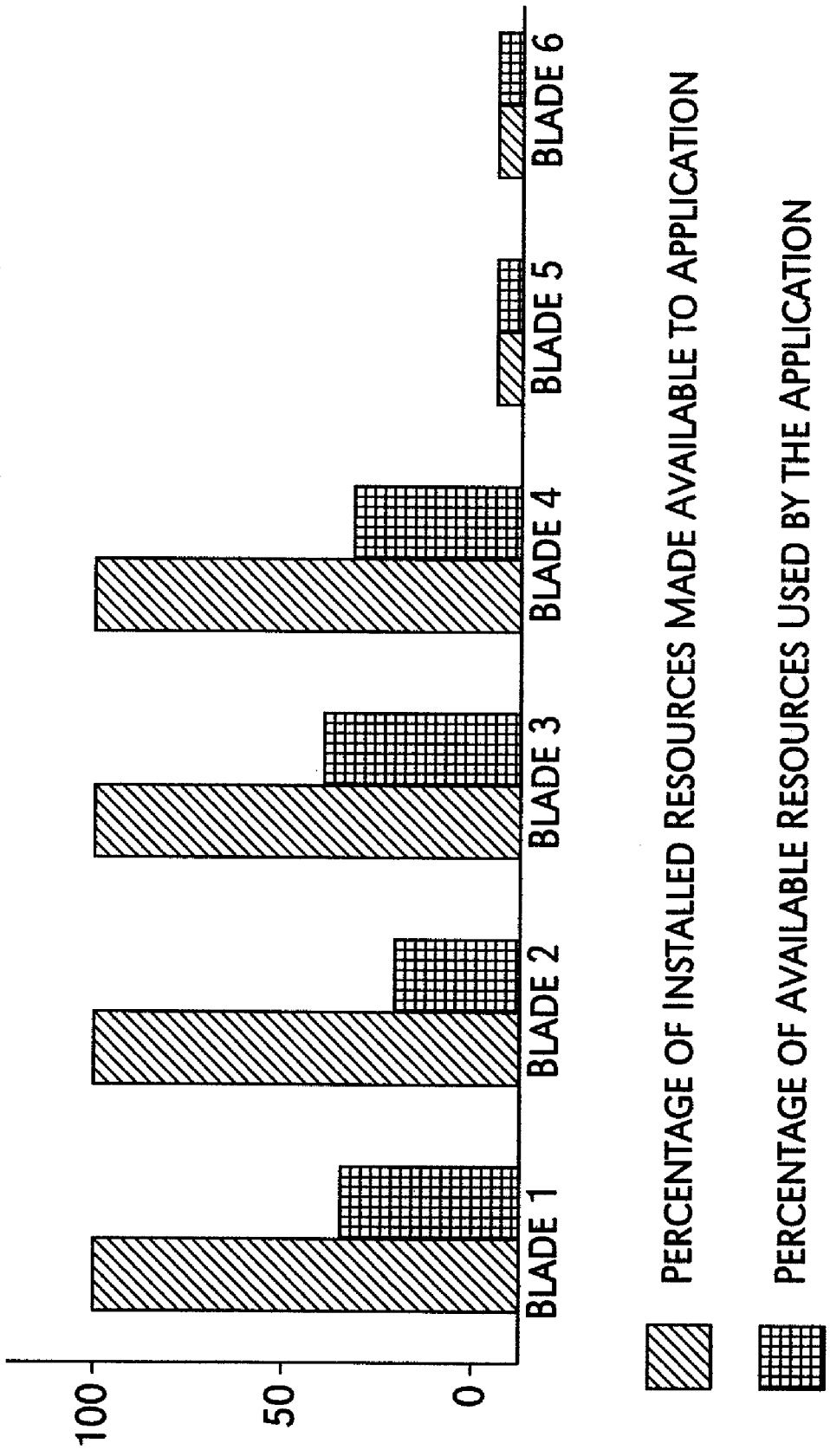
FIG. 1 illustrates a prior art scenario of resource allocation and utilization in a blade center.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
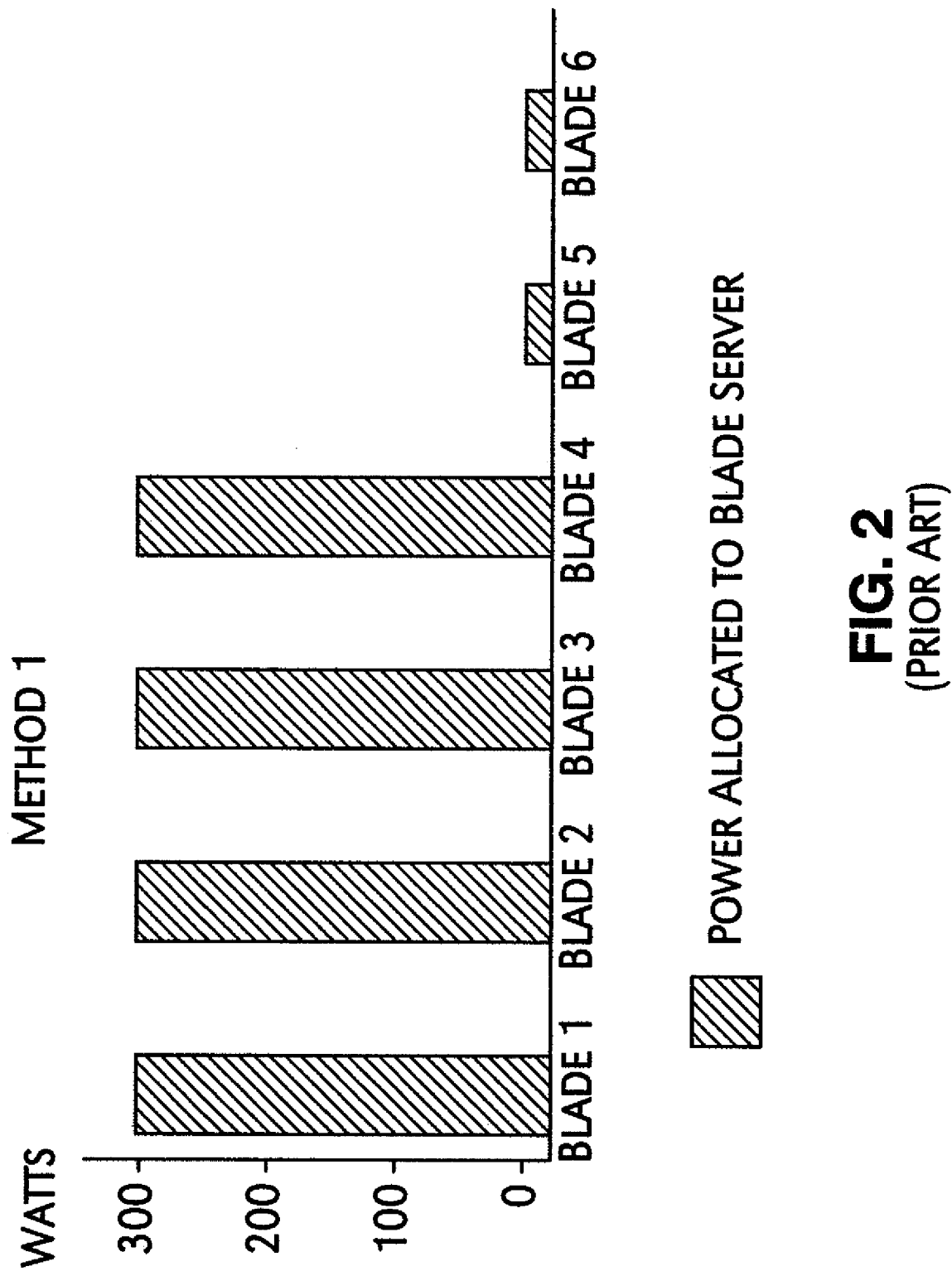
FIG. 2 illustrates a prior art method of resource allocation in a blade center.

One prior art method for allocating power within a blade center chassis is illustrated in FIGS. 1 and 2. A subset of blade servers can be allocated power sufficient to meet their maximum power consumption. This may result in underutilization of resources, as previously mentioned, where 80% of the time only X amount of resources are utilized in a system providing 2x amount of resources. Dimensioning a blade server according to the maximum power the blade server may satisfy the worst case operational scenario. However, the worst case scenario is also the infrequent case. Maximum utilization of hardware resources is commensurate with accrual of maximum benefit from ownership of the hardware. If a few of the systems in a blade center are operating at 20% utilization and the rest are turned off because of insufficient available power, clearly the customer is not deriving the maximum benefit of the hardware. In FIG. 2, a static power allocation method, without managing resource utilization and availability, is shown for an exemplary blade center chassis with six blade servers installed. The power available in the chassis is evenly distributed according to the maximum power consumption of the blade servers present. In FIG. 2, each blade server is rated at 300 W maximum power, and the power available in the chassis is 1400 W. Therefore blade servers 1-4 may be powered on under this allocation scheme consuming 1200 W of power, but blade servers 5-6 can not be powered on, even though 200 W of power remains available. In FIG. 1, the inefficiency of this method is further illustrated in view of the percentage of available resources used by applications running on blade servers 1-4, which operate at low utilization most of the time.

Figure 3:
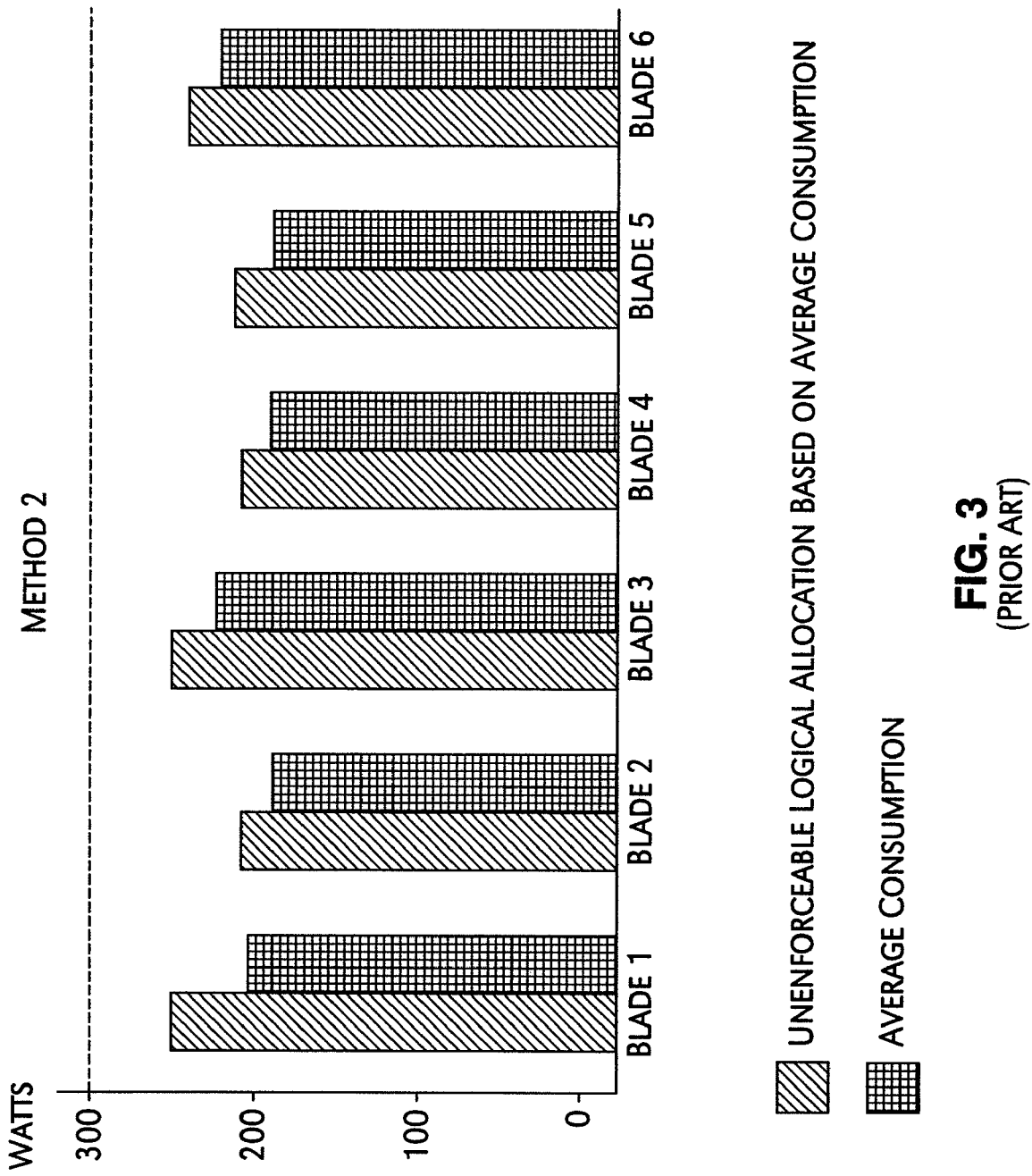
FIG. 3 illustrates a prior art method of resource allocation in a blade center.

FIG. 3 illustrates an alternative prior art method for allocating power within the same blade center chassis as referred to in FIGS. 1 and 2. This approach, where all of the systems operate unconstrained, introduces the possibility of spontaneously exceeding the power available to the systems. This may cause the power supplies to fail and all dependent systems to turn off immediately. A subset of the blade servers are allocated power for them to run at a lower percentage of their maximum power consumption, for example as illustrated in FIG. 3, either at 200 W or 250 W per blade server, for a total of about 1350 W allocated power. Since the power allocation is unenforceable, any blade server may consume a maximum of 300 W anytime during operation. Any spike in utilization by applications may result in an increase in aggregate power consumption to over 1400 W, which exceeds what the common power supply can provide, potentially causing all servers in the chassis to catastrophically fail or to be shutdown. Thus the prior art power allocation method of FIG. 3 introduces both data reliability problems as well as the general problem of having inoperable systems with periods where the work allocated to them cannot be performed.

Figure 4:
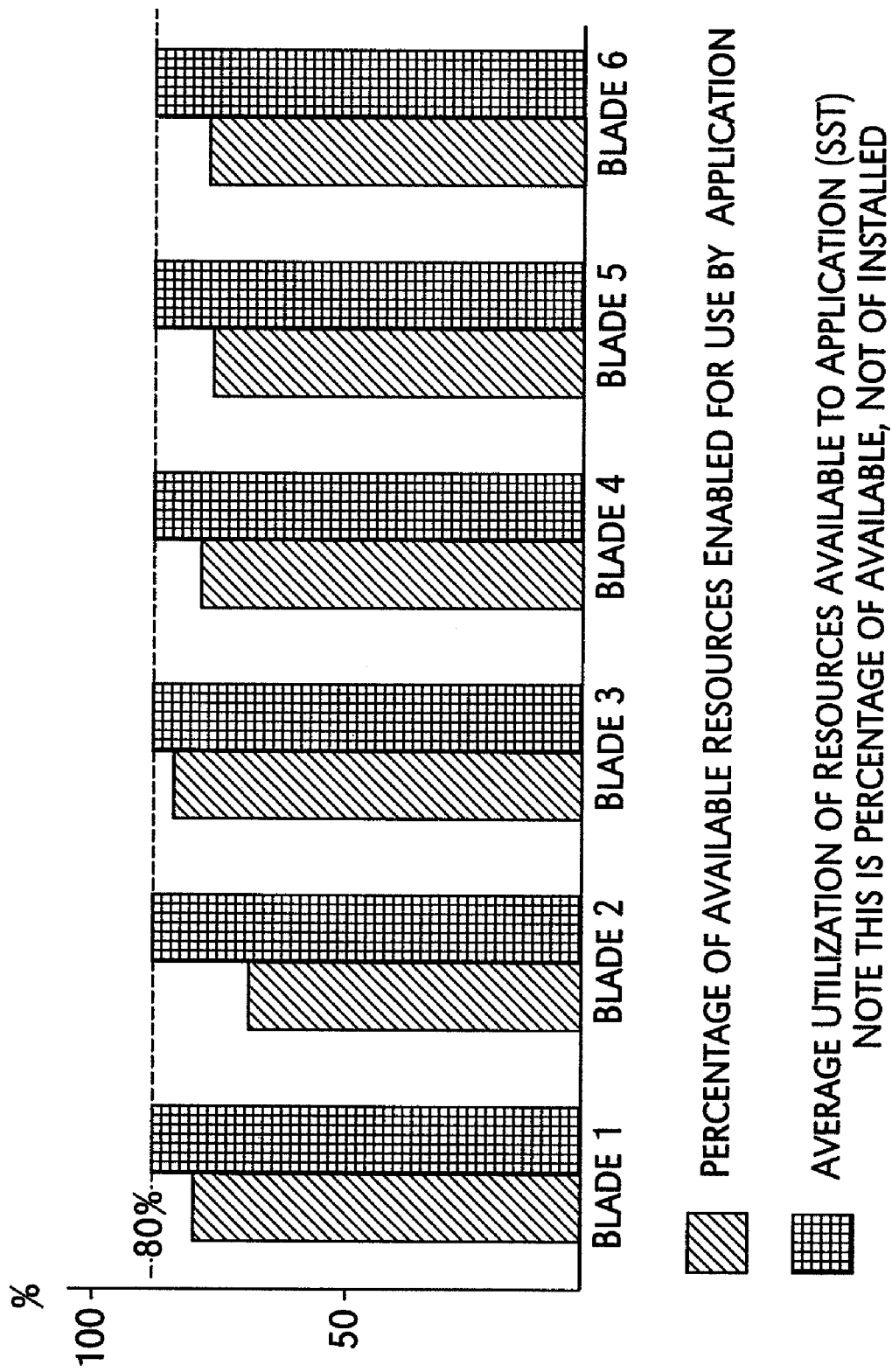
FIG. 4 illustrates resource availability and utilization in a blade center in an embodiment of the present invention.

FIG. 4 illustrates enforced resource availability and utilization in a blade center in an embodiment of the present invention. For purposes of illustration, the same blade center chassis configuration as in the previous cases, FIGS. 1-3, is referred to. However, in this case, the chassis 100 (see FIG. 10) is equipped with an enforceable power allocation system of the present invention, which conforms to the architecture embodied in FIGS. 11 and 12. In FIG. 4, each blade server 130 has a unique percentage of hardware resources, CPU 138 cycles and DIMMs 139, enabled and powered on for use by the operating system 136 and applications 133. In the steady state example illustrated in FIG. 4, the average utilization of applications 133 running on a blade server 130 is kept balanced at 80% SST of the of resources made available to them by a enforceable power allocation process of the present invention, such as shown in one case by the process steps 1110 upon booting the operating system 136. Through arbitration and brokering, as in the process 1250, the percentage of available resources may be increased to maintain an 80%

SST. In the case of work requests that result from a spike in application 133 resources, the hardware resources (CPU 138, memory 139) presented to the operating system are constrained such that a utilization spike cannot cause the blade server 130 to exceed the power allocated to it. If utilization remains critically high, a given application may fail in a fashion that is particular to it. For example, determinate work requests may not be servicable during periods where utilization remains critically high.

Figure 5:
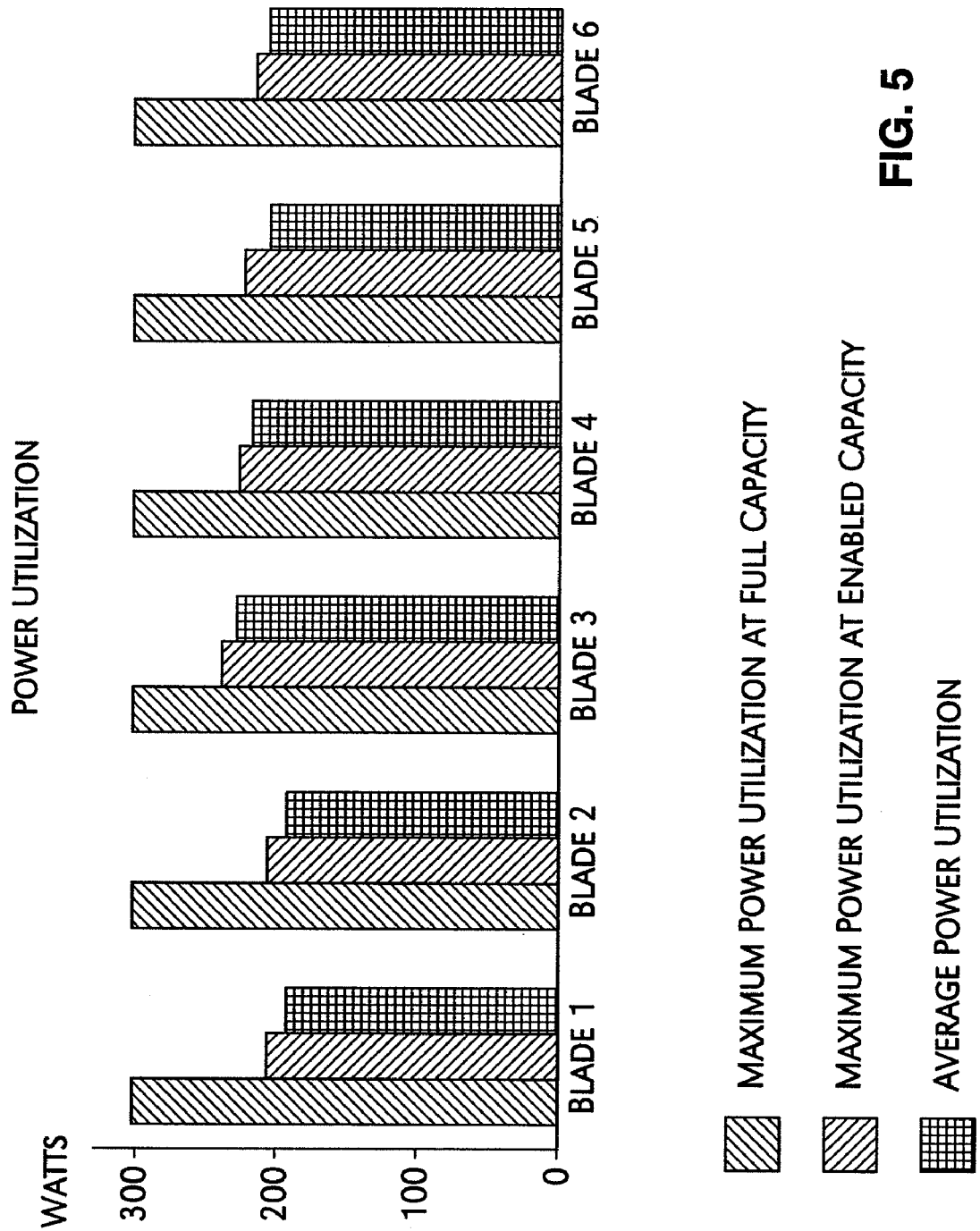
FIG. 5 illustrates power utilization in a blade center in an embodiment of the present invention.

FIG. 5 illustrates power utilization in a blade center in an embodiment of the present invention. For purposes of illustration, the same blade center chassis configuration (see FIG. 10) and enforceable power allocation scheme is referred to as in FIG. 4. In FIG. 5, the absolute values for power utilization are illustrated for each blade server 130. Note that the average power utilization is kept just below the maximum power utilization at the enabled capacity on each blade server 130. This illustrates the steady state performance of the method to regulate the enabled capacity of the present invention. In FIG. 5, the aggregate power allocated is about 1200 W, comparable to the situation in FIGS. 1-3. However, the present invention effectively mitigates the aforementioned risks of the prior art allocations methods in FIGS. 1-3.

Figure 6:
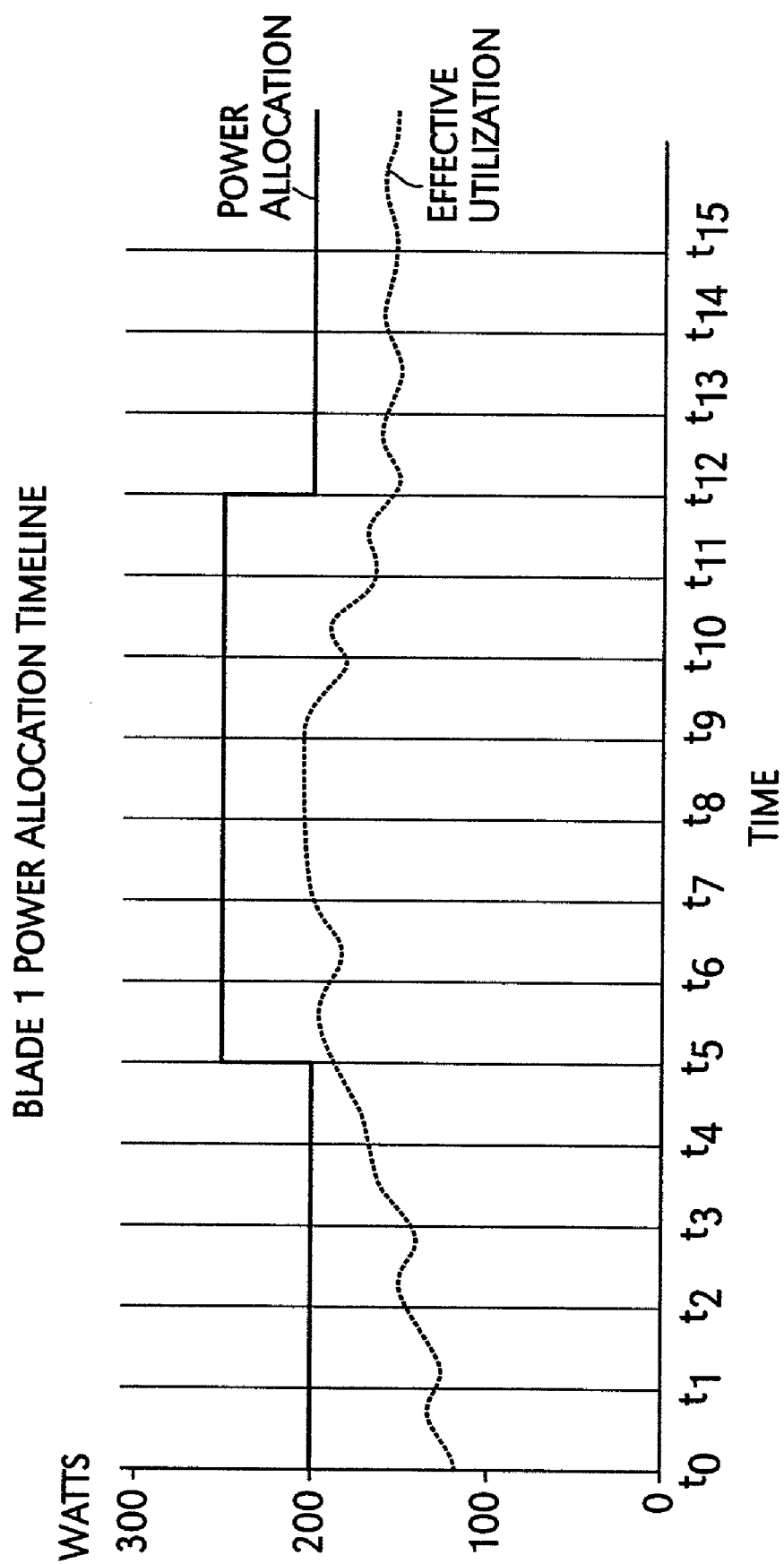
FIG. 6 illustrates a timeline of power allocation for one blade server in an embodiment of the present invention.

FIG. 6 illustrates a timeline of power allocation for one blade server 130 in an embodiment of the present invention. For purposes of illustration, the same blade center chassis configuration and enforceable power allocation scheme is referred to as in FIGS. 4 and 5. However, FIG. 6 shows how transitions in power allocation over time are managed by the present invention. Before the time $t_5$, the utilization remains below TUT for a power allocation of 200 W. At time $t_5$, the utilization begins to rise and exceeds TUT for 200 W, such that arbitration for additional power occurs by a process 1250, resulting in an additional 50 W of power allocated to the blade server 130 from the common pool. Thus from time $t_5$ to time $t_{12}$, the power allocated to the blade server 130 is 250 W. At time $t_{12}$, the utilization falls below TDT for a power allocation of 250 W, such that the blade server 130 frees up 50 W of power by a process 1210 which are brokered back into the common pool. After time $t_{12}$, the power allocated is again 200 W and the utilization remains below TUT for 200 W. This example is illustrative for one blade server 130 undergoing two transitions to increase power 1250 then reduce power 1210. In other embodiments of the present invention, the order and number of transitions may vary on each blade server 130 in each individual chassis 100.

Figure 10:
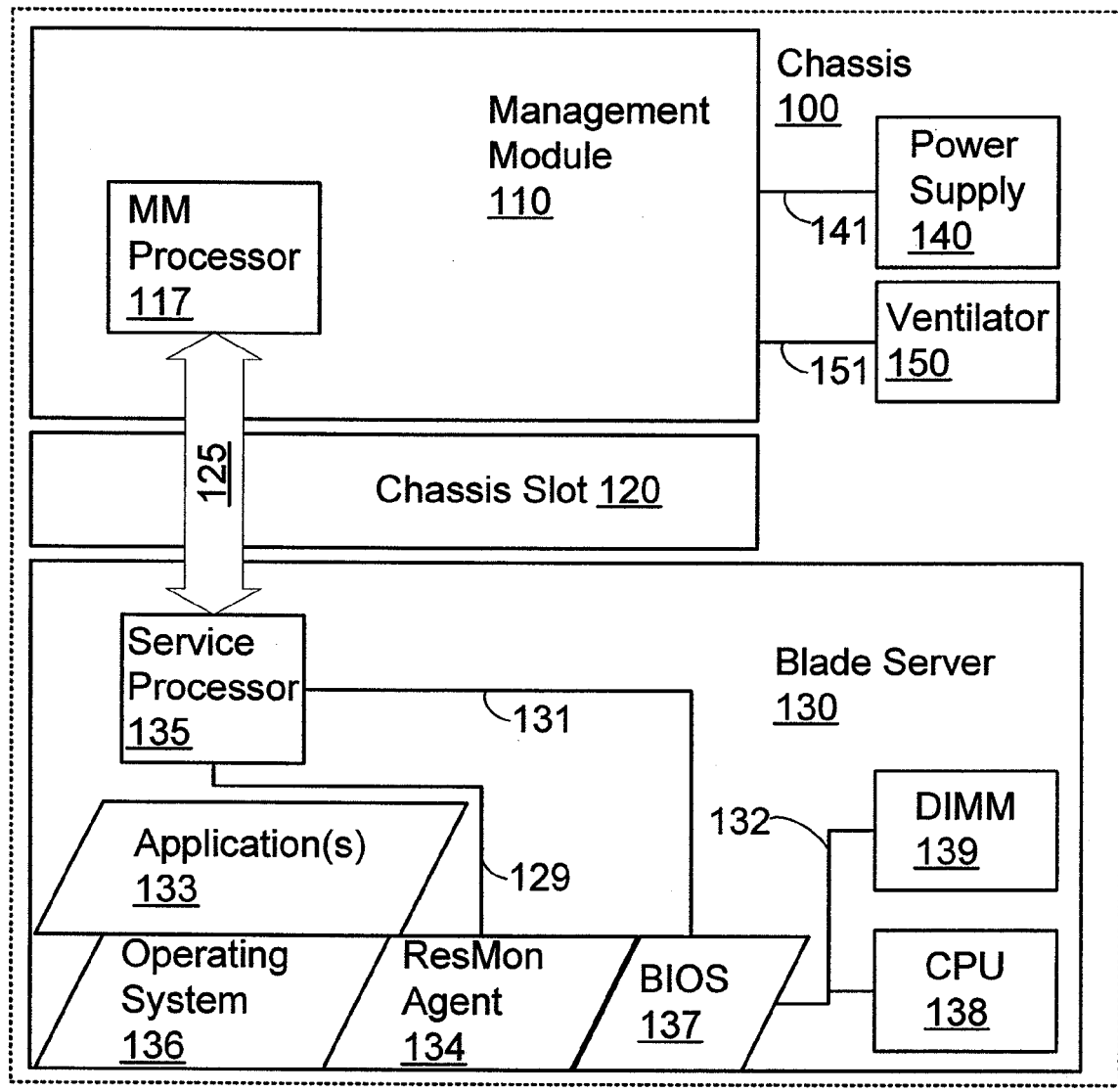
FIG. 10 illustrates system components in one embodiment of the present invention.

The system components and architecture for controlling power in a blade center chassis are illustrated in FIG. 10. A blade center chassis 100 contains the following components relevant for controlling power: blade servers 130 which reside in the chassis slots 120; management modules (MM) 110 which may contain their own MM processor 117; a common power supply 140 and ventilators 150; and communication interfaces between these components 125, 141, 151. In a blade center used to practice the present invention, the service processor (SP) 135 on a blade server 130 communicates, via the bidirectional interface 125, with the MM processor 117 on the MM 110. The MM 110 interfaces with the common power supply 140 via bus 141 and the ventilator 150 via a fan bus 151. The bidirectional interface 125 between the MM processor 117 and the SP 135, may be a multi-drop RS-485 interface. Other interface protocols for 125 may be implemented. The control buses 141, 151 may be I²C interfaces. On the blade server 130, the SP 135 communicates with a BIOS 137 (basic input/output system) via System Management Interface SMI 131 for controlling the cycle frequency of the CPU 138 or power to the individual banks of DIMMs 139. The BIOS 137, which may be embodied by firmware stored on a flash memory device, may control the CPU 138 and DIMMs 139 via interface 132, which may be SMI or another interface mechanism for controlling power consumption of CPU 138 and DIMMs 139 practiced within the scope of the present invention. A hardware resource monitoring agent software 134 communicates with the BIOS 137 and monitors the current state of CPU 138 cycles and DIMMs 139. The resource monitoring agent 134 communicates with the SP 135 via interface 129, which may be a kernel-mode driver in the operating system 136 or other communications interface. The operating system 136 and applications 133 comprise the computing load executed on the blade server 130. The operating system 136 also executes the resource monitoring agent 134 and is responsible for providing any necessary kernel-mode driver routines or hardware interface management services.

Figure 11:
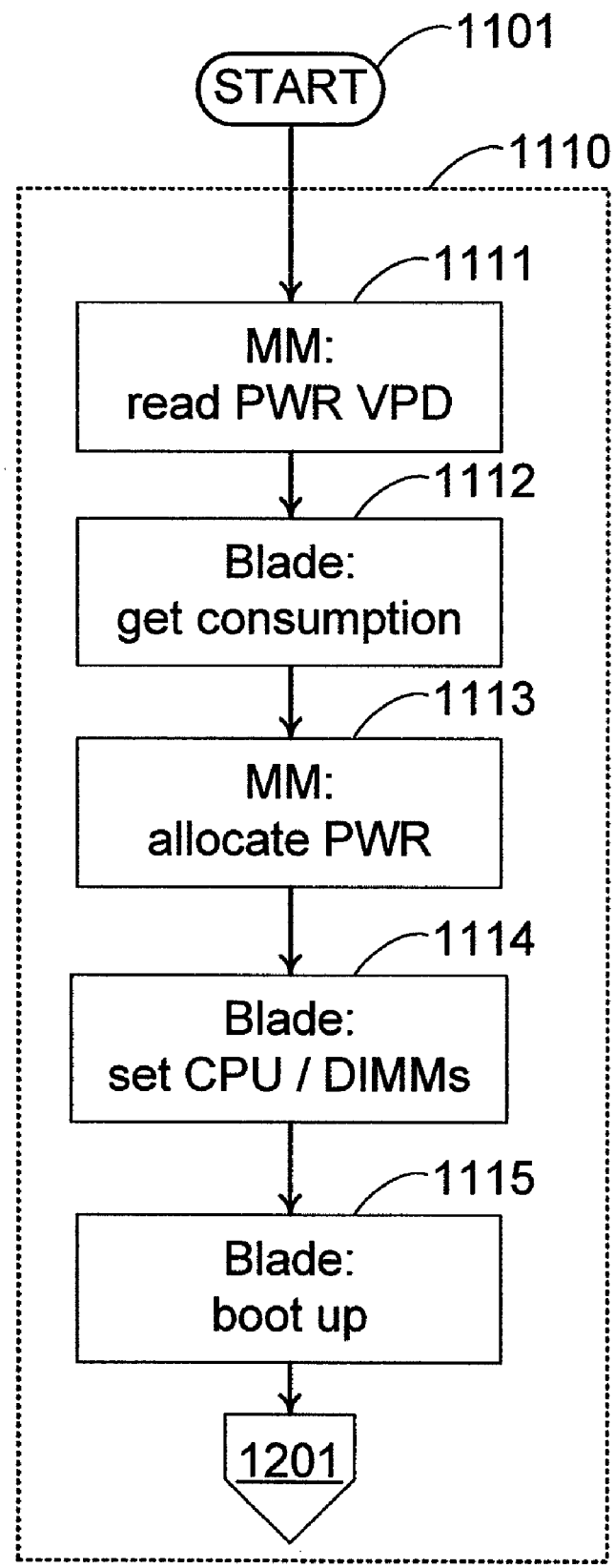
FIG. 11 is a flow-chart of the power on portion of a power cycle process in one embodiment of the present invention.

FIG. 11 is a flow-chart of the power on portion 1110 of a power cycle process in one embodiment of the present invention. A MM 110 present in a blade center chassis 100 will be responsible for allocating and brokering power resources from a common power supply 140 among the blade servers 130 installed in the slots 120 in the chassis 100. There are multiple blade servers 130, each of which contain an SP 135 and a BIOS 137, running an operating system 136. At system initialization 1101, the MM 110 determines the amount of power available in the chassis 100 by reading 1111 the vital product data (VPD) of the power supplies 140 in the chassis 100, resulting in a maximum available power (MAP). For each blade server 130, the SP 135 communicates with the BIOS 137 via SMI or other interface 131 to determine 1112 power consumption of each DIMM, capacity of each DIMM, CPU stepping levels, and CPU power consumption at each stepping level. Assuming that N blade servers 130 are present in the blade center chassis 100, the MM 110 then allocates 1113 a fixed amount of power, in one example a value equivalent to MAP/N, to each blade server 130. Alternate methods for determining how much power to provide 1113 each individual blade server 130 may be policy based, historical for the chassis 100 (maintained by the MM 110), historical for the blade server 130 (maintained by the blade server 130), determined by an external authority, or otherwise rule based in various other embodiments of the present invention. The difference between the MAP and the aggregate power allocated to each blade server 130 is the amount of power initially available in the common pool. The allocation of power 1113 by the MM 110 is executed by communicating a message from the MM processor 117 via interface 125 to the SP 135. Based on the power consumption values determined in 1112 of memory DIMMs and the CPU at different stepping levels, the SP 135 informs the BIOS 137 via SMI or other interface 131 of the initial configuration that should be made available to the operating system 136. This configuration comprises the number of DIMMs 139 to enable (and which specific modules thereof), and the throttling step level that the CPU 138 should be set to. The BIOS 137 then sets the appropriate configuration 1114 via interface 132, and subsequently allows the operating system 136 to boot 1115. After the blade server 130 is booted, the power allocation portion 1250, 1210 of the power cycle begins 1201, and repeats until the blade server 130 is shut down 1202.

Figure 12:
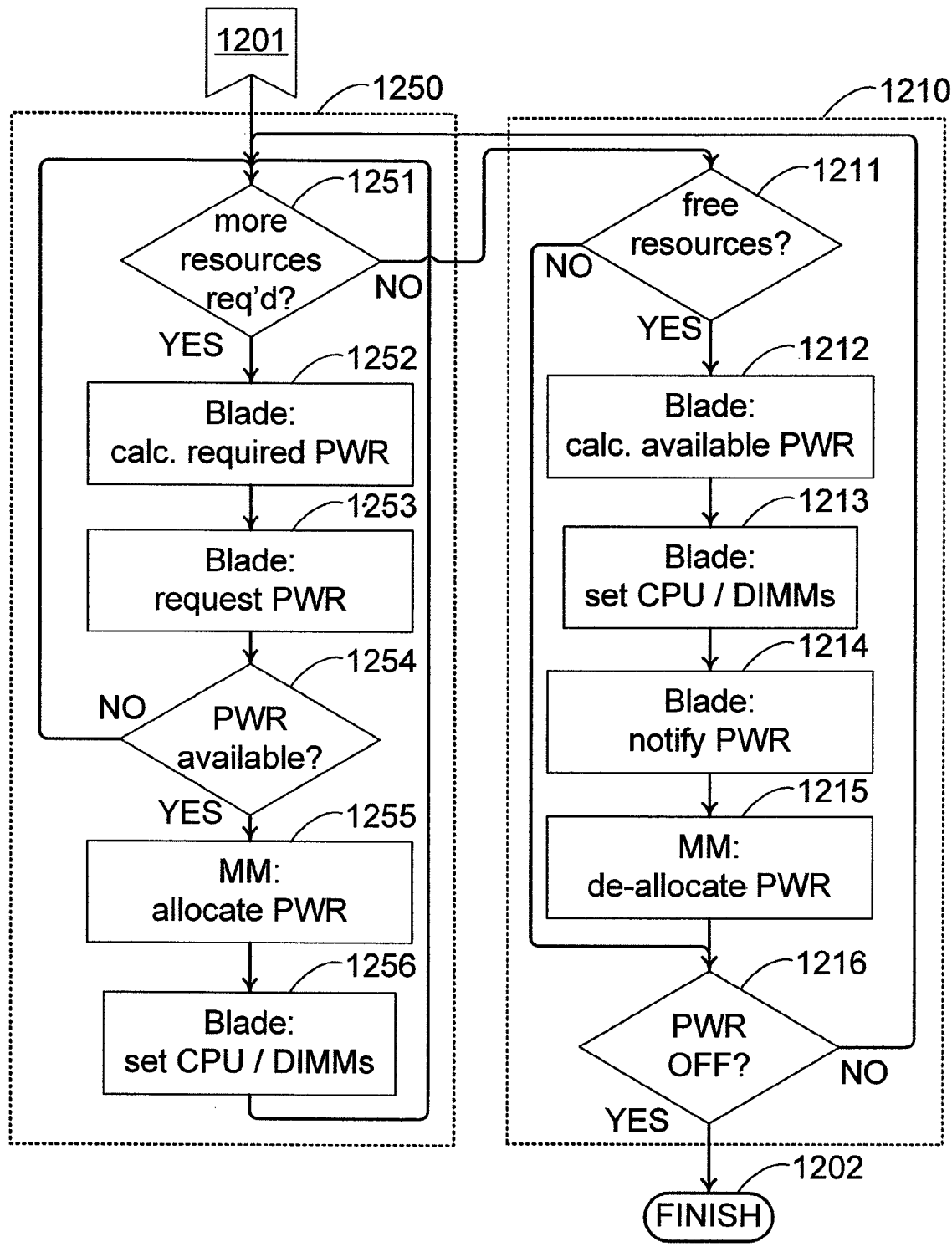
FIG. 12 is a flow-chart of the power allocation portion of a power cycle process in one embodiment of the present invention.

FIG. 12 is a flow-chart of the power allocation portion 1250, 1210 of a power cycle process in one embodiment of the present invention. The power allocation events include transferring power from the common pool to a blade server 130 requiring a higher power allocation 1250 and transferring power from a blade server 130 utilizing a lower amount of power than currently allocated back to the common pool

1210. The power cycle process ends 1202 after the blade server 130 is powered down 1216.

When power allocation to blade server 130 is increased 1250, an initial determination 1251 by the resource monitoring agent software 134, which monitors CPU 138 and memory 139 utilization values SST and TUT, has been made that more resources are required. This determination 1251 may be result of a trend analysis, as illustrated in FIG. 6, policy driven by an external entity, such as an administrator, rule-based, or derived from any combination of systematic criteria applied in individual embodiments of the present invention. In one case, the determination 1251 may result from considerations which balance the responsiveness of the system versus minimizing overall power consumption, such as the implementation of a control algorithm. In another case, a trend analysis across several power cycle processes 1110, 1250, 1210 may yield recorded historical threshold values for proactively triggering the determination 1251. In yet another case, the determination 1251 may be schedule driven, where an adminstrator has recognized that spikes in application utilization will occur at a particular time and date, or where a regular pattern of utilization, such as normal business hours, require schedule-dependent resource management. When the resource monitoring software agent 134 has determined 1251 that more resources are required, the agent 134 issues a service request to the SP 135 to enable the additional hardware resources, CPU 138 cycles and/or DIMMs 139. The SP 135 then calculates 1252 the additional power required to enable the requested hardware resources. The SP 135 then issues a request 1253 to the MM 110 which is responsible for brokering the power in the common pool for the additional amount of power. If the MM 110, acting in its capacity as the resource broker under consideration of all applicable rules and policies, determines 1254 that more power should be made available to the requesting blade server 130, the MM 110 will send a confirmation response 1255 back to the SP 135 indicating the actual amount of additional power that is allocated to the blade server 130 from the common pool. Note that the amount of power confirmed by the MM 110 may differ from, i.e. may be lower than, the amount requested by the SP 135. The SP 135 will then confirm the directives of the MM 110 to the BIOS 137 via SMI 131 by requesting that the CPU 138 speed be stepped up, or additional memory DIMMs 139 be enabled as is appropriate. Note that the CPU step increase and number of additional DIMMs enabled may differ from the original request to the SP 135 by the BIOS 137. The BIOS 137 then sets the hardware resources 1256 in compliance with the request by the SP 135. Note that the MM 110 remains the governing authority for all increases in power allocated in the chassis 100 during brokering 1250 and must approve all requests for additional power from the blade servers 130. The blade servers 130 must conform to the directives of the MM 110 and must be enabled to conform to the architecture requirements.

When power allocation to blade server 130 is decreased 1210, a initial determination 1211 by the resource monitoring agent software 134, which monitors CPU 138 and memory 139 utilization values SST and TDT, has been made that resources may be freed. This determination 1211 may be result of a trend analysis, as illustrated in FIG. 6, policy driven by an external entity, such as an administrator, rule-based, or derived from any combination of systematic criteria applied in individual embodiments of the present invention. In one case, the determination 1211 may result from considerations which balance the responsiveness of the system versus minimizing overall power consumption, such as the implementation of a control algorithm. In another case, a trend analysis across several power cycle processes 1110, 1250, 1210 may yield recorded historical threshold values for proactively triggering the determination 1211. In yet another case, the determination 1211 may be schedule driven, where an adminstrator has recognized that troughs in application utilization will occur at a particular time and date, or where a regular pattern of utilization, such as normal business hours, require schedule-dependent resource management. When the resource monitoring software agent 134 has determined 1211 that fewer resources are required, the agent 134 issues a service request to the SP 135 to disable some of the enabled hardware resources, CPU 138 cycles and/or DIMMs 139. The SP 135 then calculates 1212 the additional power that can be made availabe to the common pool by disabling the requested hardware resources. The SP 135 then issues a request 1213 to the BIOS 137 via SMI 131 by requesting that the CPU 138 speed be stepped down, or additional memory DIMMs 139 be disabled as is appropriate. After the power consumption of the blade server 130 has been reduced 1213 by the BIOS, the SP 135 notifies 1214 the MM 110 that additional power has been made available to the common pool. The MM 110, acting in its capacity as the resource broker under consideration of all applicable rules and policies, de-allocates the power for the blade server 130 and sends a confirmation response 1216 back to the SP 135 indicating the actual amount of additional power that has been allocated to the common pool from the blade server 130. Note that the blade server 130 is required to relinquish power in a timely manner back to the common pool 1210 for the MM 110 to be able to broker future requests for more power 1250 from other blade servers 130 in the chassis 100.

Figure 7:
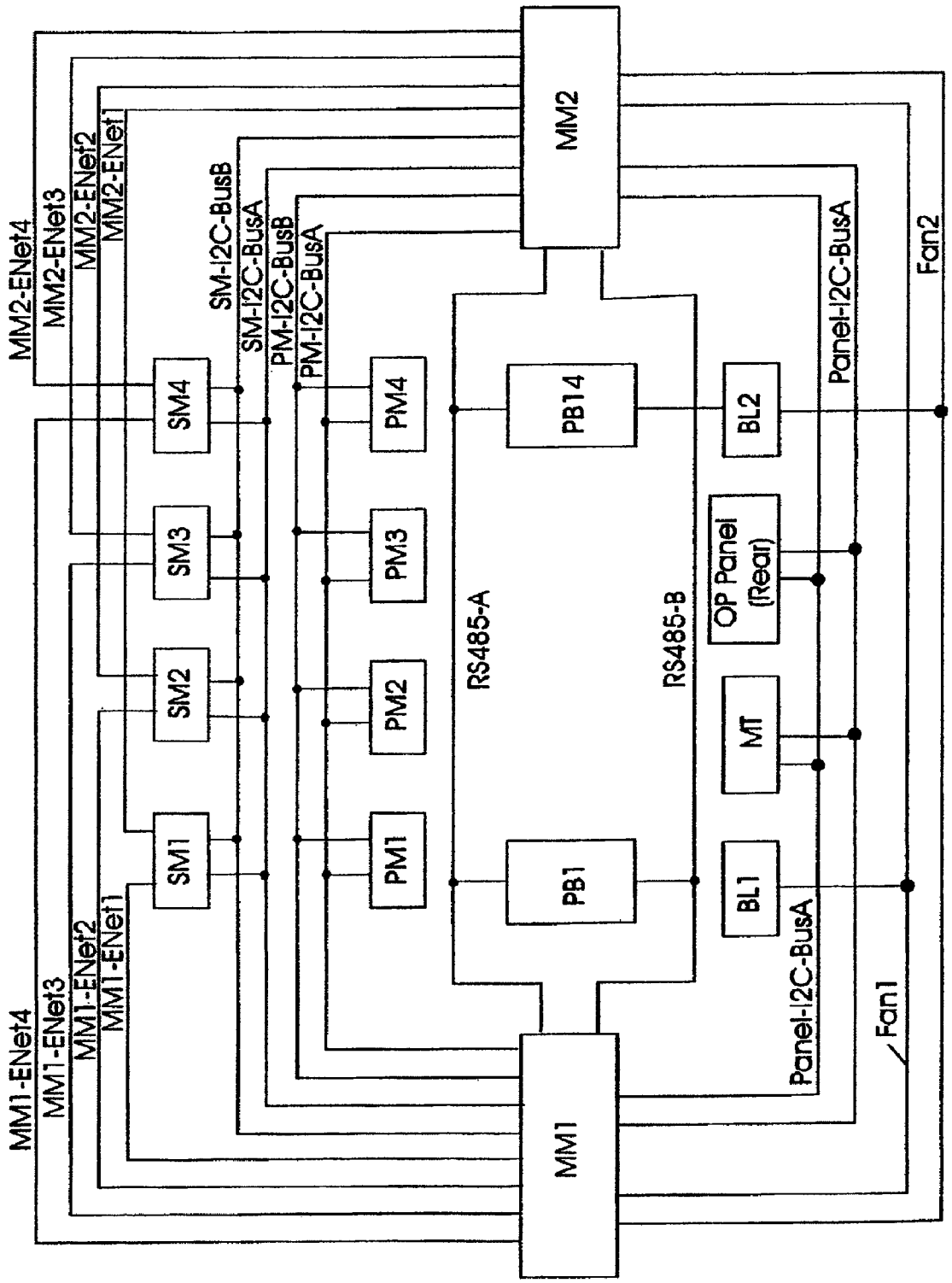
FIG. 7 illustrates a schematic diagram of a blade center management subsystem.

FIG. 7 is a schematic diagram of a blade center chassis management subsystem, showing engineering details of the individual management modules MM1-MM4, previously represented schematically by MM 110, and showing engineering details of the individual components contained in previous schematic representations of blade center chassis 100. Referring to this figure, each management module has a separate Ethernet link to each one of the switch modules SMI through SM4. Thus, management module MM1 is linked to switch modules SMI through SM4 via Ethernet links MM1-ENet1 through MM1-ENet4, and management module MM2 is linked to the switch modules via Ethernet links MM2-ENet1 through MM2-ENet4. In addition, the management modules are also coupled to the switch modules via two well known serial I$^2$C buses SM-I$^2$C-BusA and SM-I2C-BusB, which provide for "out-of-band" communication between the management modules and the switch modules. Similarly, the management modules are also coupled to the power modules (previously represented schematically by 140) PM1 through PM4 via two serial I$^2$C buses (corresponding to interface 141) PM-I$^2$C-BusA and PM-I$^2$C-BusB. Two more I$^2$C buses Panel-I$^2$C-BusA and Panel-I$^2$C-BusB are coupled to media tray MT and the rear panel. Blowers BL1 and BL2 (previously represented schematically by 150) are controlled over separate serial buses Fan1 and Fan2 (corresponding to interface 151). Two well known RS485 serial buses RS485-A and RS485-B are coupled to server blades PB1 through PB14 for "out-of-band" communication between the management modules and the server blades.

Figure 8:
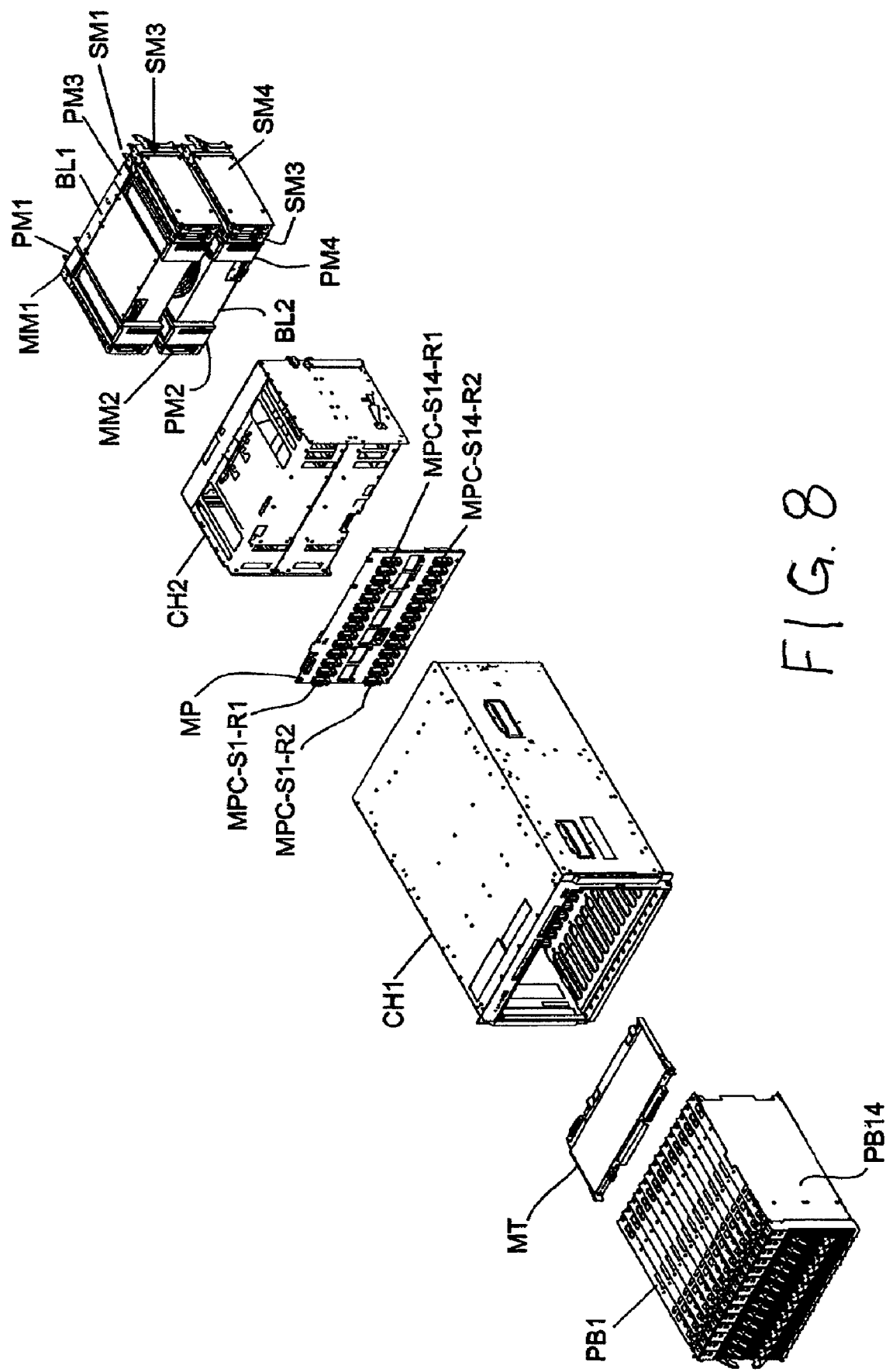
FIG. 8 illustrates a front, top and right side exploded perspective view of a blade center chassis of the present invention.

FIG. 8 illustrates a front, top and right side exploded perspective view of a blade server system, showing engineering details of the individual components contained in previous schematic representations of blade center chassis 100. Referring to this figure, main chassis CH1 houses all the components of the blade server system. Up to 14 processor blades PB1 through PB14 (or other blades, such as storage blades) are hot pluggable into the 14 slots in the front of chassis CH1.

The term "server blade", "blade server", "processor blade", or simply "blade" is used throughout the specification and claims, but it should be understood that these terms are not limited to blades that only perform "processor" or "server" functions, but also include blades that perform other functions, such as storage blades, which typically include hard disk drives and whose primary function is data storage.

Processor blades provide the processor, memory, hard disk storage and firmware of an industry standard server. In addition, they include keyboard, video and mouse (KVM) selection via a control panel, an onboard service processor, and access to the floppy and CD-ROM drives in the media tray. A daughter card may be connected via an onboard PCI-X interface and is used to provide additional high-speed links to various modules. Each processor blade also has a front panel with 5 LED's to indicate current status, plus four push-button switches for power on/off, selection of processor blade, reset, and NMI for core dumps for local control.

Blades may be "hot swapped", meaning removed or installed in the power on state, without affecting the operation of other blades in the system. A blade server is typically implemented as a single slot card (394 mm×227 mm); however, in some cases a single processor blade may require two or more slots. A processor blade can use any microprocessor technology as long as it is compliant with the mechanical and electrical interfaces, and the power and cooling requirements of the blade server system.

For redundancy, processor blades have two signal and power connectors; one connected to the upper connector of the corresponding slot of midplane MP (described below), and the other connected to the corresponding lower connector of the midplane. Processor Blades interface with other components in the blade server system via the following midplane interfaces: 1. Gigabit Ethernet (2 per blade; required); 2. Fiber Channel (2 per blade; optional); 3. management module serial link; 4. VGA analog video link; 4. keyboard/mouse USB link; 5. CD-ROM and floppy disk drive (FDD) USB link; 6. 12 VDC power; and 7. miscellaneous control signals. These interfaces provide the ability to communicate with other components in the blade server system such as management modules, switch modules, the CD-ROM and the FDD. These interfaces are duplicated on the midplane to provide redundancy. A processor blade typically supports booting from the media tray CDROM or FDD, the network (Fiber channel or Ethernet), or its local hard disk drive.

A media tray MT includes a floppy disk drive and a CD-ROM drive that can be coupled to any one of the 14 blades. The media tray also houses an interface board on which is mounted interface LED's, a thermistor for measuring inlet air temperature, and a 4-port USB controller hub. System level interface controls consist of power, location, over temperature, information, and general fault LED's and a USB port.

Midplane circuit board MP is positioned approximately in the middle of chassis CH1 and includes two rows of connectors; the top row including connectors MPC-S1-R1 through MPC-S14-R1, and the bottom row including connectors MPC-S1-R2 through MPC-S14-R2. Thus, each one of the 14 slots includes one pair of midplane connectors located one above the other (e.g., connectors MPC-S1-R1 and MPC-S1-R2) and each pair of midplane connectors mates to a pair of connectors at the rear edge of each processor blade (not visible in FIG. 8).

Figure 9:
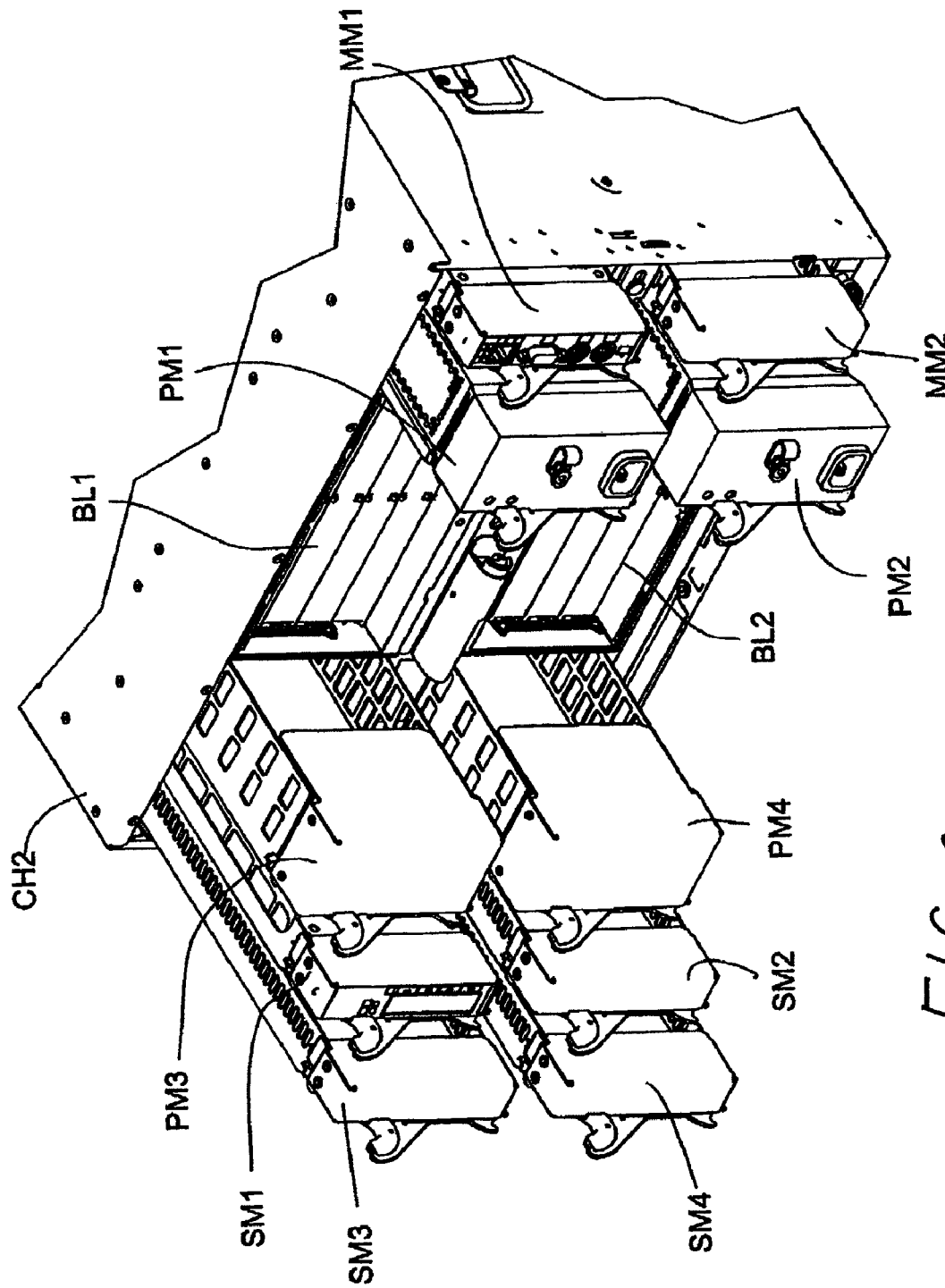
FIG. 9 illustrates a rear, top and left side perspective view of the rear portion of the blade center chassis of the present invention.

FIG. 9 is a rear, top and left side perspective view of the rear portion of the blade server system. Referring to FIGS. 8 and 9, a chassis CH2 houses various hot pluggable components for cooling, power, control and switching. Chassis CH2 slides and latches into the rear of main chassis CH1.

Two hot pluggable blowers BL1 and BL2 (previously represented schematically by 150) include backward-curved impeller blowers and provide redundant cooling to the blade server system components. Airflow is from the front to the rear of chassis CH1. Each of the processor blades PB1 through PB14 includes a front grille to admit air, and low-profile vapor chamber based heat sinks are used to cool the processors within the blades. Total airflow through the system chassis is about 300 CFM at 0.7 inches $H_2O$ static pressure drop. In the event of blower failure or removal, the speed of the remaining blower automatically increases to maintain the required air flow until the replacement unit is installed. Blower speed control is also controlled via a thermistor that constantly monitors inlet air temperature. The temperature of the blade server system components are also monitored and blower speed will increase automatically in response to rising temperature levels as reported by the various temperature sensors.

Four hot pluggable power modules PM1 through PM4 (previously represented schematically by 140) provide DC operating voltages for the processor blades and other components. One pair of power modules provides power to all the management modules and switch modules, plus any blades that are plugged into slots 1-6. The other pair of power modules provides power to any blades in slots 7-14. Within each pair of power modules, one power module acts as a backup for the other in the event the first power module fails or is removed. Thus, a minimum of two active power modules are required to power a fully featured and configured chassis loaded with 14 processor blades, 4 switch modules, 2 blowers, and 2 management modules. However, four power modules are needed to provide full redundancy and backup capability. The power modules are designed for operation between an AC input voltage range of 200 VAC to 240 VAC at 50/60 Hz and use an IEC320 C14 male appliance coupler. The power modules provide +12 VDC output to the midplane from which all blade server system components get their power. Two +12 VDC midplane power buses are used for redundancy and active current sharing of the output load between redundant power modules is performed.

Management modules MM1 through MM4 (previously represented schematically by 110) are hot-pluggable components that provide basic management functions such as controlling, monitoring, alerting, restarting and diagnostics. Management modules also provide other functions required to manage shared resources, such as the ability to switch the common keyboard, video, and mouse signals among processor blades.

Although the present invention and its advantages have been described in detail, it should be understood that various changes, substitutions and alterations can be made herein without departing from the spirit and scope of the invention as defined by the appended claims.

What is claimed is:

1. A blade center chassis apparatus comprising:
   a plurality of blade servers populating a plurality of chassis slots;
   a management module;
   a power supply common to said plurality of chassis slots for powering said plurality of blade servers, wherein said power supply further comprises a plurality of power modules; and circuitry built into said management module operable for:
- reading a total power capacity of said blade center chassis by querying each of said plurality of power modules installed in said blade center chassis;
- calculating a maximum power load dissipated by said plurality of blade servers by querying a power consumption value of each of said plurality of blade servers;
- allocating an individual amount of power to each of said plurality of blade servers, wherein a total amount of individual power allocated remains less than said total power capacity of said blade center chassis; and
- brokering said total power capacity in said blade center chassis by changing said individual amount of power allocated to each of said plurality of blade servers.

2. The apparatus of claim 1, wherein said circuitry built into said management module operable for said querying a power consumption value of each of said plurality of blade servers further comprises circuitry operable for:
- issuing a service request to a service processor on said blade server; and
- receiving power consumption values from said service processor.

3. The apparatus of claim 1, wherein said circuitry built into said management module, operable for said brokering said total power capacity in said blade center chassis by changing said individual amount of power allocated to each of said plurality of blade servers, further comprises circuitry operable for:
- receiving a request from a service processor on a blade server for an increase in the power allocated to said blade server;
- determining when said increase in the power allocated to said blade server may be granted by transferring power from power allocated to a common pool to said blade server;
- determining an individual increase in allocation of power to said blade server from the available amount of said power allocated to said common pool; and
- confirming said individual increase in allocation of power to said blade server.

4. The apparatus of claim 1, wherein said circuitry built into said management module, operable for said brokering said total power capacity in said blade center chassis by changing said individual amount of power allocated to each of said plurality of blade servers, further comprises circuitry operable for:
- receiving a notice from a service processor on a blade server that the power consumption of said blade server has been decreased, wherein said notice includes the amount that said power consumption of said blade server has been decreased; and
- transferring an individual decrease in allocation of power from said blade server to the available amount of power allocated to a common pool, in relation to said amount that said power consumption of said blade server has been decreased.

5. A blade server device comprising a service processor for communications and resource management functions, wherein said service processor further comprises circuitry operable for:
- determining power consumption settings of power-consuming resources on said blade server by communicating with a BIOS on said blade server;
- calculating power consumption values based on said power consumption settings; and
- communicating said power consumption values to a management module in a blade center chassis populated by said blade server;

wherein said service processor further comprises circuitry operable for:
- enforcing a reduced amount of allocated power to said blade server, further comprising the steps of:
  - determining power consumption settings of power-consuming resources on said blade server;
  - issuing a request to a BIOS of said blade server to apply said power consumption settings; and
  - deactivating by said BIOS of said power-consuming resources, wherein said deactivating results in a decrease in power consumption; and
  - notifying said management module of said reduced amount of allocated power to said blade server.

\* \* \* \* \*